United States Patent
Lee et al.

(10) Patent No.: US 8,043,896 B2
(45) Date of Patent: Oct. 25, 2011

(54) SEMICONDUCTOR CHIP, METHOD OF MANUFACTURING THE SEMICONDUCTOR CHIP AND SEMICONDUCTOR CHIP PACKAGE INCLUDING AN INCLINED VIA HOLE

(75) Inventors: Tae Soo Lee, Seoul (KR); Yun Hwi Park, Gyunggi-Do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 12/651,234

(22) Filed: Dec. 31, 2009

(65) Prior Publication Data

US 2010/0105171 A1    Apr. 29, 2010

Related U.S. Application Data

(62) Division of application No. 11/702,131, filed on Feb. 5, 2007, now abandoned.

(30) Foreign Application Priority Data

May 16, 2006   (KR) .................. 10-2006-0043946

(51) Int. Cl.
*H01L 21/44*  (2006.01)
*H01L 21/48*  (2006.01)
*H01L 21/50*  (2006.01)

(52) U.S. Cl. ........................ 438/113; 438/675
(58) Field of Classification Search ............ 438/113, 438/675; 257/E21.586, E21.599
See application file for complete search history.

(56) References Cited

U.S. PATENT DOCUMENTS

| | | | |
|---|---|---|---|
| 6,392,290 | B1 | 5/2002 | Kasem et al. |
| 6,838,748 | B2 | 1/2005 | Ishio et al. |
| 6,888,253 | B1* | 5/2005 | Rogers et al. ............... 257/774 |
| 2004/0080045 | A1 | 4/2004 | Kimura et al. |
| 2006/0038245 | A1 | 2/2006 | Terui |
| 2006/0055053 | A1* | 3/2006 | Yamazaki et al. ............ 257/778 |

FOREIGN PATENT DOCUMENTS

| | | |
|---|---|---|
| JP | 2000-031207 | 1/2000 |
| JP | 2004-152812 | 5/2004 |
| JP | 2006-059839 | 3/2006 |

OTHER PUBLICATIONS

Japanese Office Action issued in Japanese Patent Application No. JP 2007-017452 dated Nov. 10, 2009.
Chinese Office Action, w/ English translation thereof, issued in Chinese Patent Application No. CN 2007100801372 dated on Oct. 10, 2008.

\* cited by examiner

*Primary Examiner* — William M. Brewster
(74) *Attorney, Agent, or Firm* — McDermott Will & Emery LLP

(57) ABSTRACT

In a semiconductor chip, a body has a top surface where a pattern is formed, an underside surface opposing the top surface and a plurality of side surfaces. A plurality of electrode pads are formed on the top surface of the body to connect to an external terminal. A shielding conductive film is formed on the surfaces excluding the top surface of the body where the pattern is formed. A conductive via is extended through the body to connect one of the electrode pads with the conductive film.

1 Claim, 4 Drawing Sheets (a)

(b)

(a)

(b)

SEMICONDUCTOR CHIP, METHOD OF MANUFACTURING THE SEMICONDUCTOR CHIP AND SEMICONDUCTOR CHIP PACKAGE INCLUDING AN INCLINED VIA HOLE

RELATED APPLICATIONS

This application is a Divisional of U.S. application Ser. No. 11/702,131, filed on Feb. 5, 2007, now abandoned, claiming priority of Korean Application No. 10-2006-0043946, filed on May 16, 2006, the entire contents of each of which are hereby incorporation by reference.

BACKGROUND OF THE INVENTION

1. Field of the Invention

The present invention relates to a semiconductor chip package, more particularly, in which a shielding conductive film is connected to a ground through a via hole, and a manufacturing method thereof.

2. Description of the Related Art

A high frequency module for use in a mobile telecommunication device such as a mobile phone is constructed of a high frequency circuit including a high frequency semiconductor device and a periphery circuit that are formed on a substrate thereof.

In general, current propagating in an electronic device induces electric field and magnetic field therearound, thereby generating a space due to electric potential difference. Here, the electric field changes with time and generates electric magnetic field therearound. That is, regardless of the induction of the device, current flows to create electromagnetic noise, which is an unnecessary energy.

Such electromagnetic noise, if transferred to other devices through a path, leads to degradation in performance and malfunction thereof.

To shield the electromagnetic noise and protect the semiconductor device, a shielding technique for forming a shielding film has been employed.

FIGS. 1a and 1b illustrate a shielding structure according to the prior art.

FIG. 1a is a cross-sectional view illustrating a high frequency module having a high frequency semiconductor device 12 on a substrate 11 shielded via a metal cap 13.

In the conventional shielding structure of the high frequency module shown in FIG. 1a, the metal cap 13, if reduced in its thickness, cannot remain strong but is easily warped, potentially contacting the high frequency device. To prevent short-circuit caused by contact between the metal cap 13 and the high frequency device, a certain space should be preserved under the metal cap 13 to accommodate the metal cap 13 that may be warped. For example, the metal cap should be formed to a thickness of 100 µm, and an inner space thereof should be designed to a thickness of 80 µm. This physical volume stands in the way of miniaturization of the high frequency module.

FIG. 1b is a cross-sectional view illustrating the high frequency module in which the shielding film is formed via a metal film 15 after resin molding.

In FIG. 1b, the high frequency semiconductor device 12 is mounted on the substrate 11 and resin molded to be hermetically sealed. Then the shielding film is formed on a surface of a mold 14 using the metal film 15.

This leads to smaller physical volume compared to a case where the metal cap is adopted. Yet, the metal film formed on the mold is not connected to a ground of the substrate, thus insignificant in terms of shielding effects.

SUMMARY OF THE INVENTION

The present invention has been made to solve the foregoing problems of the prior art and therefore an aspect of the present invention is to provide a semiconductor chip which has a shielding layer formed thereon to connect to a ground, when the semiconductor chip is mounted on a substrate, thereby to enhance shielding effects and ensure the chip to be mounted in a minimal volume, and a semiconductor package having the semiconductor chip.

Another aspect of the present invention is to provide a method of manufacturing the semiconductor chip having the shielding layer formed on a wafer.

According to an aspect of the invention, the invention provides a semiconductor chip including a body having a top surface where a pattern is formed, an underside surface opposing the top surface and a plurality of side surfaces; a plurality of electrode pads formed on the top surface of the body to connect to an external terminal; a shielding conductive film formed on the surfaces excluding the top surface of the body where the pattern is formed; and a conductive via extending through the body to connect one of the electrode pads with the conductive film.

The electrode pad connected to the conductive via may be connected to an external ground and grounded.

The conductive film is formed only on the underside surface of the body.

According to another aspect of the invention, the invention provides a semiconductor chip package including the semiconductor chip as described above; a substrate where a ground lead pattern and a plurality of lead patterns are formed; and a plurality of bumps disposed between the respective electrode pads of the semiconductor chip and the respective lead patterns of the substrate to electrically connect the semiconductor chip with the substrate.

The electrode pad connected to the via hole is connected to the ground lead pattern of the substrate.

The conductive film is formed only on the underside surface of the semiconductor chip.

According to further another aspect of the invention, the invention provides a method for manufacturing a semiconductor chip including:

forming via holes in a wafer including unit chip areas to connect from an electrode pad on a top surface of a wafer where a pattern is formed to an underside surface of the wafer opposing the top surface so that at least one of the via holes is formed in each of the unit chip areas;

filling the via hole with conductive material;

forming a conductive film on the underside surface of the wafer to contact the conductive material filled in the via hole; and cutting the wafer into unit chips.

The manufacturing method may further include forming a shielding conductive material on a side surface of the cut semiconductor chip.

BRIEF DESCRIPTION OF THE DRAWINGS

The above and other objects, features and other advantages of the present invention will be more clearly understood from the following detailed description taken in conjunction with the accompanying drawings, in which:

FIGS. 4a to 4d are perspective views illustrating a flow of a method for manufacturing a semiconductor chip of FIG. 3a.

DETAILED DESCRIPTION OF THE PREFERRED EMBODIMENT

Exemplary embodiments of the present invention will now be described in detail with reference to the accompanying drawings.

Figure 1:
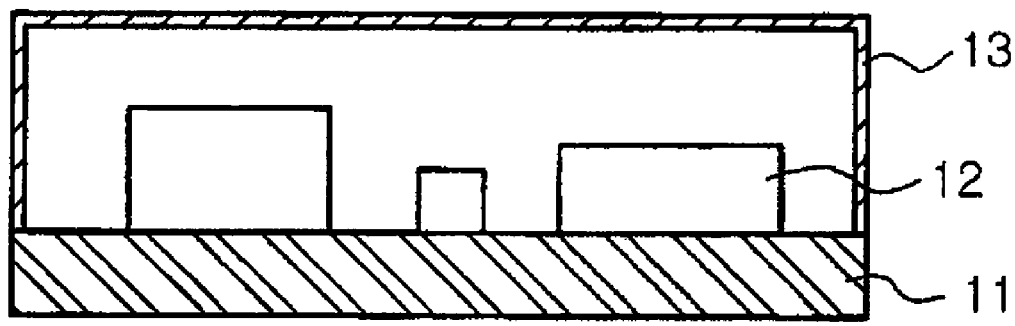
FIGS. 1a and 1b are cross-sectional views illustrating a shielding structure according to the prior art.
Figure 1:
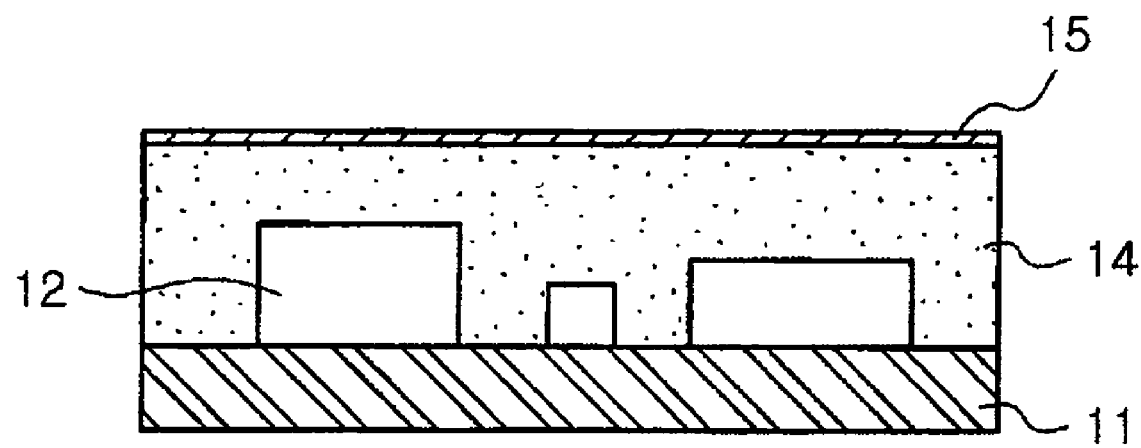
Figure 2:
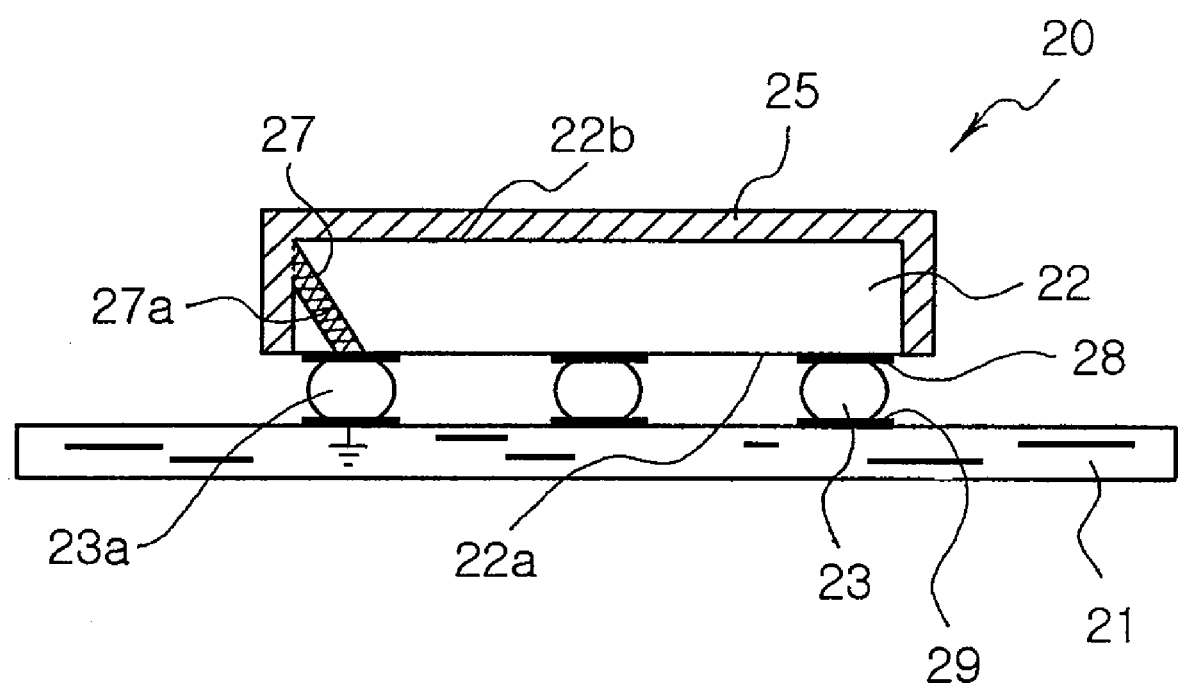
FIG. 2 is a cross-sectional view illustrating a semiconductor chip package according to an embodiment of the invention.

FIG. 2 is a cross-sectional view illustrating a semiconductor chip package having a semiconductor chip mounted on a substrate according to an embodiment of the invention.

Referring to FIG. 2, the semiconductor chip 20 is flip-bonded onto the substrate 21.

The semiconductor chip 20 has a body 22 provided with a plurality of electrode pads 28 on a top surface 22a thereof.

A conductive film 25 is formed on an underside surface 22b and side surfaces of the body 22 of the semiconductor chip where the electrode pads are not formed. Also, a via hole 27 is perforated through the top surface 22a and one of the side surfaces of the body 22.

The package substrate 21 is manufacturable by the same process as the one for fabricating a printed circuit board (PCB), or by High Temperature Chemical Cleaning (HTCC) or Low Temperature Co-fired Ceramics (LTCC).

A circuit pattern is disposed on the package substrate 21 to input and output a signal, and vias are formed to be connected respectively with electrode pads on the circuit pattern to form a ground lead pattern. The ground lead pattern is configured to electrically connect the electrode pads on overlying and underlying layers together.

As shown in FIG. 2, bumps 23 made of metal are formed on the lead patterns of the circuit pattern disposed on the package substrate 21, and the semiconductor chip is mounted on the electrode pads 28 via the bumps 23. The flip-bonded semiconductor chip allows the electrode pads 28 to be electrically connected to the lead patterns on the package substrate 21 by the bumps 23.

In the semiconductor chip, the electrode pads 28 on the top surface 22a of the body 22 are connected to the substrate 21 by the bumps 23, some of which are ground bumps 23a connected to a ground of the substrate. The bumps 23 formed between the lead patterns 29 of the substrate 21 and the electrode pads 28 of the semiconductor chip are made of gold, copper, aluminum or alloys thereof and serve to connect wires of the substrate with the semiconductor chip.

The ground bumps 23a are in direct contact with a conductive via filled with a conductive material in the via hole 27 and serve to electrically connect the conductive film 25 with the ground. Of course, although the conductive via 27a is directly connected to the bumps 23, the conductive via 27a, if electrically connected to the ground bumps 23a on the substrate, may realize this feature of the invention.

In this fashion, the conductive film 25 formed on the underside surface 22b and the side surfaces of the body 22 of the semiconductor chip is electrically connected to the ground. As a result, electromagnetic wave generated from the semiconductor chip is induced to flow toward the ground, and thus blocked. This accordingly inhibits occurrence of noises. Further, this shields electromagnetic wave induced to the semiconductor chip from outside, thereby suppressing interference from the electromagnetic wave.

To easily form the conductive film 25 on the underside surface 22b and the side surfaces of the semiconductor chip, conductive paint is directly applied on the top surface and side surfaces of the semiconductor chip or sprayed thereonto.

Figure 3:
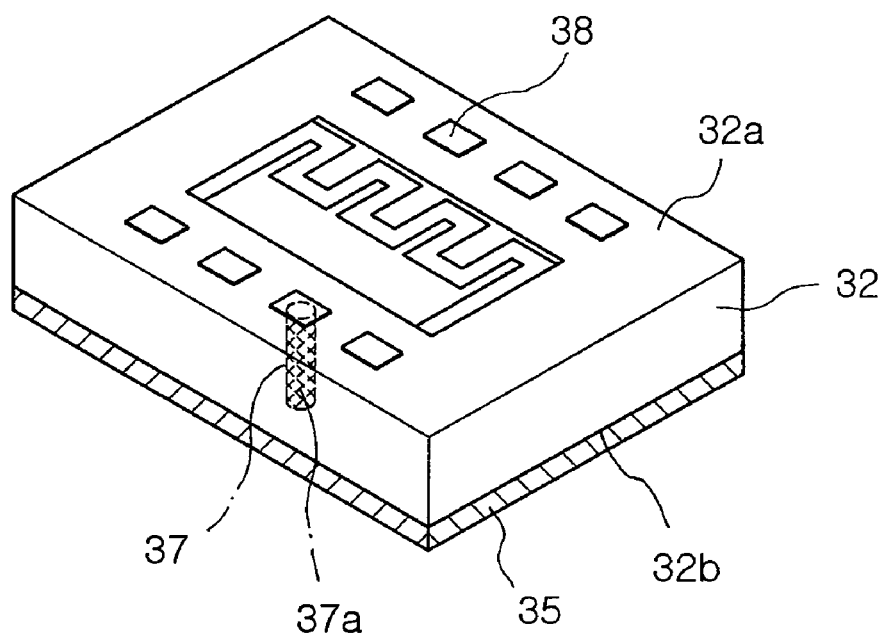
FIG. 3a is a perspective view illustrating a semiconductor chip according to another embodiment of the invention.
FIG. 3b is a cross-sectional view illustrating a semiconductor chip package.
Figure 3:
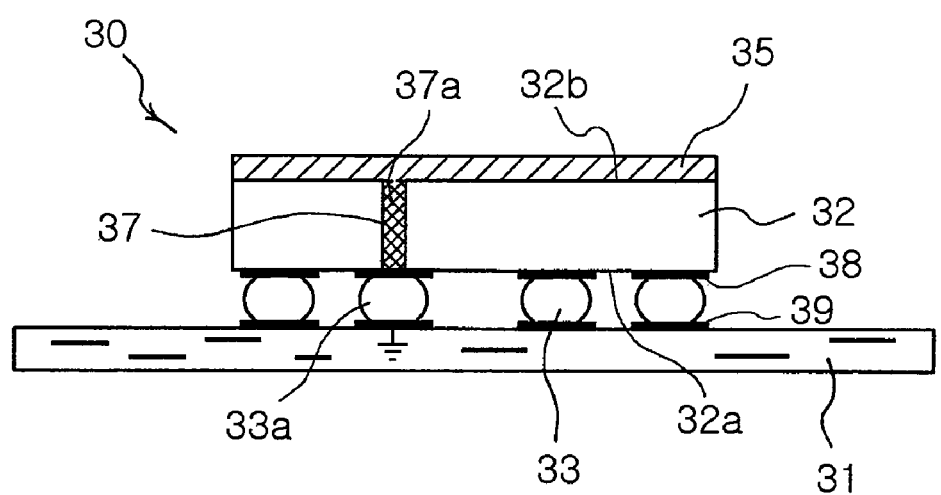

FIG. 3a is a perspective view illustrating a semiconductor chip according to an embodiment of the invention.

Referring to FIG. 3a, the semiconductor chip has a body provided with electrode pads 38 on a top surface 32a thereof where patterns are formed, and a metal film 35 on an underside surface 32b thereof. The metal film 35 has a via hole 37 perforated through the body 32 of the semiconductor chip. The metal film 35 is brought in contact with a conductive via 37a filled with a conductive material in the via hole 37. The via hole 37 is connected to the electrode pads 38 on the top surface 32a of the semiconductor chip body 32.

The via hole 37 can be formed by laser processing or dry etching such as reactive ion etch. The via hole 37 may feature various shapes such as a circle, a triangle and a polygon. The via hole 37 may have a uniform cross-section. Alternatively, the via hole 37 may have a cross-section that is greater or smaller in proportion to its proximity to the top surface 32a thereof.

The via hole 37 is filled with a conductive material to form the conductive via 37a and extended to the electrode pads on the top surface 32a of the semiconductor chip body 32 to electrically connect the conductive film 35 with a ground on the substrate.

The conductive via 37a can be formed by electroplating and the conductive material adopts all electroplatable metals such as gold (Au), silver (Ag), copper (Cu), aluminum (Al), nickel (Ni), and tungsten (W).

Alternatively, the conductive via 37a may be formed by vacuum evaporation, sputtering, chemical vapor deposition and by filling-up and sintering of a conductive paste. The conductive material for filling the via hole 37 is exemplified by gold (Au), silver (Ag), copper (Cu), aluminum (Al), nickel (Ni), tungsten (W) and alloys thereof.

To easily form the conductive film 35 on the underside surface 32b of the semiconductor chip body 32, conductive paint is directly applied to the underside surface of the semiconductor chip body or sprayed thereonto.

FIG. 3b is a cross-sectional view illustrating a semiconductor chip package having a semiconductor chip mounted on a substrate.

Referring to FIG. 3b, the semiconductor chip is flip-bonded onto the substrate 31.

The semiconductor chip has a body 32 provided with a plurality of electrode pads 38 on a top surface 32a thereof.

A conductive film 35 is formed on an underside surface 32b of the semiconductor chip body 32 where electrode pads are not formed. Also, a via hole 37 is perforated through the top surface 32a and the underside surface 32b of the semiconductor chip body 32.

Further, the electrode pads 38 on the top surface 32a of the semiconductor chip body 32 are connected to lead patterns 39 on the substrate 31 via bumps 33, some of which are ground bumps 33a connected to a ground on the substrate. The bumps formed between the lead patterns 39 of the substrate 31 and the electrode pads 38 of the semiconductor chip are made of gold, copper, aluminum or alloys thereof, and serve to connect wires of the substrate with the chip.

The ground bumps 33a are made in direct contact with the conductive via 37a filled with a conductive material in the via hole 37 and serve to electrically connect the conductive film 35 to the ground on the substrate. Of course, although the conductive via 37a is directly connected to another one of the bumps 33, the conductive via 37a, if electrically connected to the ground bumps 33a on the substrate, may realize this feature of the invention.

Although not illustrated, a barrier metal film may be formed to facilitate bonding between the ground bumps 33a and the conductive via 37a and prevent cracks from heat accompanied by use of the chip, thereby ensuring reliability of the chip. The barrier metal film may be made of one selected from a group consisting of titanium (Ti), titanium nitride (TiN), tantalum nitride (TaN), Ti/TiN and Ta/TaN. The barrier metal film is preferably formed by chemical vapor deposition.

The via hole 37 is filled with a conductive material to form the conductive via 37a and extended to the ground bumps 33a formed on the electrode pads disposed on the top surface 32a of the semiconductor chip body 32 to electrically connect the conductive film 35 with the ground on the substrate.

In this fashion, the conductive film 35 formed on the underside surface 32b of the semiconductor chip body 32 is electrically connected to the ground. As a result, electromagnetic wave generated from the semiconductor chip is induced to flow toward the ground, and thus blocked. This accordingly inhibits occurrence of noises. Also, this shields electromagnetic wave induced to the semiconductor chip from the outside, thereby suppressing interference from the electromagnetic wave.

The conductive film 35 can be formed merely on the underside surface 32b of the semiconductor chip body 32 when individual semiconductor chips are applied with a conductive film material separately from one another.

Here, at least one via hole is perforated through the top surface and underside surface of the semiconductor chip body 32 and filled with a conductive material. Then a conductive film is formed on the underside surface of the semiconductor chip body to be brought in contact with the conductive material. The conductive film 35 can be easily formed by directly applying or spraying conductive paint for shielding electromagnetic wave.

Alternatively, in a structure where the conductive film is formed on the underside surface of the semiconductor chip, the via hole and the conductive film are formed on a wafer before being cut into the unit chips, and then cut into the unit chips. This accordingly simplifies a manufacturing method.

FIGS. 4a to 4d illustrate a manufacturing method in which the semiconductor chip of FIG. 3a is fabricated on a wafer.

To fabricate the semiconductor chip having a conductive film therein on the wafer, the wafer is prepared, at least one via hole is formed in each of unit chip areas on the wafer, a conductive material is filled in the via hole, a conductive film is formed on an underside surface of the wafer and the wafer is cut into unit chips.

Figure 4:
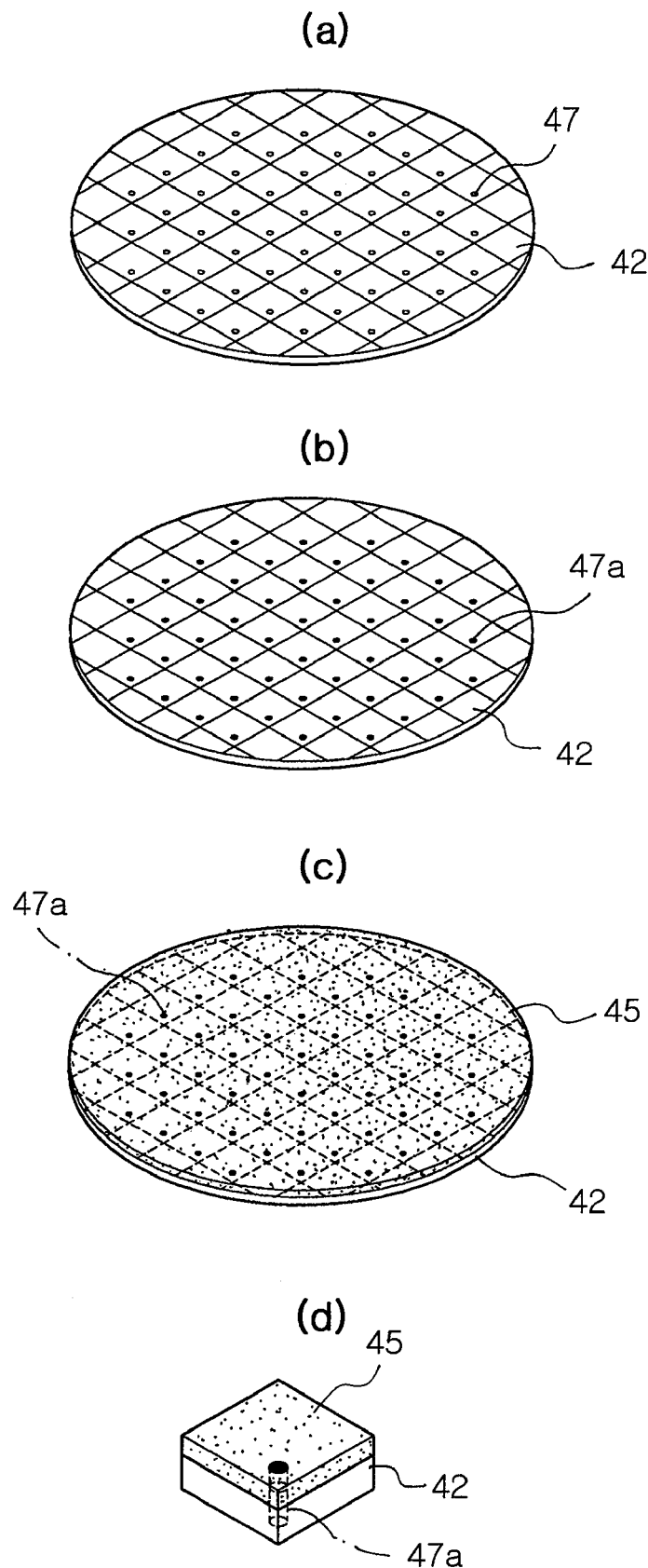

Referring to FIG. 4a, a via hole is formed on each of the unit chip areas to connect from electrode pads on the top surface of the wafer where patterns and the electrode pads are formed to the underside surface of the wafer. FIG. 4a is a perspective view in which the underside surface of the wafer faces upward. The via hole 47 is formed by mechanical polishing or laser processing. To realize an aspect of the invention, at least one via hole is necessarily formed on each of the unit chip areas. Here, the via hole is connected to one of the electrode pads disposed around patterns (not illustrated) formed on the top surface of the wafer. That is, the electrode pads are connected to a ground of the substrate.

Referring to FIG. 4b, the via hole 47 formed on each of the unit chip areas is filled with a conductive material to form a conductive via 47a. This allows the conductive film 45 on the underside surface of the semiconductor chip body 42 to electrically connect to the ground of the substrate.

Referring to FIG. 4c, the conductive film is formed on the underside surface of the wafer. The conductive film 45 can be formed by directly applying or spraying conductive paint for shielding electromagnetic wave. This simplifies a process and saves material costs compared with a case where the conductive film is formed on each of the unit chips.

Here, the conductive film 45 is in direct contact with the conductive via 47a filled with a conductive material in the via hole 47. Preferably, the conductive film 45 is made of the same conductive material filled in the via hole 47.

Referring to FIG. 4d, the wafer is cut into each of the unit chips to produce the semiconductor chip according to the invention. The conductive film 45 is formed on the underside surface of the semiconductor chip body 42 and brought in contact with the conductive material filled in the via hole 47. Accordingly, the conductive via 47a connects the conductive film 45 with the ground of the substrate.

Furthermore, optionally a shielding conductive material may be formed on side surfaces of the cut semiconductor chip to boost shielding effects of the conductive film.

Although not illustrated, the cut semiconductor chip is flip bonded onto the substrate to connect the conductive via to the ground of the substrate, thereby producing the semiconductor chip package according to the invention.

The embodiments and the accompanying drawings are illustrative only but do not limit the invention. Thus, the conductive film and the via hole can be located variously.

As set forth above, according to exemplary embodiments of the invention, when a semiconductor chip is mounted on a substrate, a shielding metal film is connected to a ground to boost shielding effects of electromagnetic wave and ensure the chip to be mounted in a minimal volume.

In addition, the semiconductor chip can be fabricated on a wafer to simplify a manufacturing process.

While the present invention has been shown and described in connection with the preferred embodiments, it will be apparent to those skilled in the art that modifications and variations can be made without departing from the spirit and scope of the invention as defined by the appended claims.

What is claimed is:

1. A method for manufacturing a semiconductor chip wherein at least one via hole is a concentric cylinder cross-section around a primary axis and the primary axis extends at an incline through the chip from the electrode pad on the top surface to the shielding conductive material on the side surface of the chip comprising:
    forming via holes in a wafer including unit chip areas to connect from an electrode pad on a top surface of a wafer where a pattern is formed to an underside surface of the wafer opposing the top surface so that at least one of the via holes is formed in each of the unit chip areas;
    filling the via hole with conductive material;
    forming a conductive film which is electrically connected to a ground on the underside surface of the wafer to contact the conductive material filled in the via hole;
    cutting the wafer into unit chips; and
    forming a shielding conductive material which is electrically connected to the conductive film on a side surface of the cut semiconductor chip.

* * * * *